United States Patent [19]

Hayes

[11] Patent Number: 4,694,255

[45] Date of Patent: Sep. 15, 1987

[54] RADIO FREQUENCY FIELD COIL FOR NMR

[75] Inventor: Cecil E. Hayes, Wauwatosa, Wis.

[73] Assignee: General Electric Company, Milwaukee, Wis.

[21] Appl. No.: 548,745

[22] Filed: Nov. 4, 1983

[51] Int. Cl.[4] ............................................. G01R 33/20
[52] U.S. Cl. .................................... 324/318; 324/322
[58] Field of Search ............... 324/300, 302, 304, 318, 324/319, 322, 313, 316; 343/896; 361/292, 294, 295, 296; 335/296, 298, 299; 128/422, 424; 333/219, 227, 231, 235

[56] References Cited

U.S. PATENT DOCUMENTS

| | | | |
|---|---|---|---|
| 2,267,613 | 12/1941 | Lindenblad | 343/896 |
| 2,774,967 | 12/1956 | Lundburg | 343/896 |
| 2,830,212 | 4/1958 | Hanlet | 324/300 |
| 3,771,055 | 11/1973 | Anderson | 324/322 |
| 3,783,419 | 1/1974 | Lafond | 324/300 |
| 3,919,678 | 11/1975 | Penfold | 335/296 |
| 3,953,789 | 4/1976 | Veeman | 324/322 |
| 4,320,342 | 3/1982 | Heinzerling | 324/320 |
| 4,339,718 | 7/1982 | Bull | 324/319 |
| 4,398,149 | 8/1983 | Zens | 324/300 |
| 4,439,733 | 3/1984 | Hinshaw | 324/318 |
| 4,506,224 | 3/1985 | Krause | 324/300 |
| 4,573,015 | 2/1986 | Abe et al. | 324/309 |

FOREIGN PATENT DOCUMENTS 0047065 3/1982 European Pat. Off. ............... 318/

OTHER PUBLICATIONS

Journal of Magnetic Resonance 35, No. 3, pp. 329-336 (Sep. 1979), "Simultaneous Multinuclear NMR by Alternate Scan Recording of $^{31}P$ and C Spectra"; Styles.

Nuclear Magnetic Resonance Imaging in Medicine—Igaku-Shoin, 1981, Leon Kaufman, pp. 62-64.

Principles of Electrical Engineering: Theory and Practice, Grover C. Blalock, McGraw-Hill Inc., New York, 1950, pp. 85-100.

Primary Examiner—Stewart J. Levy
Assistant Examiner—Scott M. Oldham
Attorney, Agent, or Firm—Douglas E. Stoner

[57] ABSTRACT

An NMR radio-frequency coil is made up of a plurality of conductive segments evenly spaced about the peripheries and interconnecting a pair of conductive loop elements. Each conductive segment includes at least one reactive element which may include a variable capacitive or inductive element.

57 Claims, 26 Drawing Figures

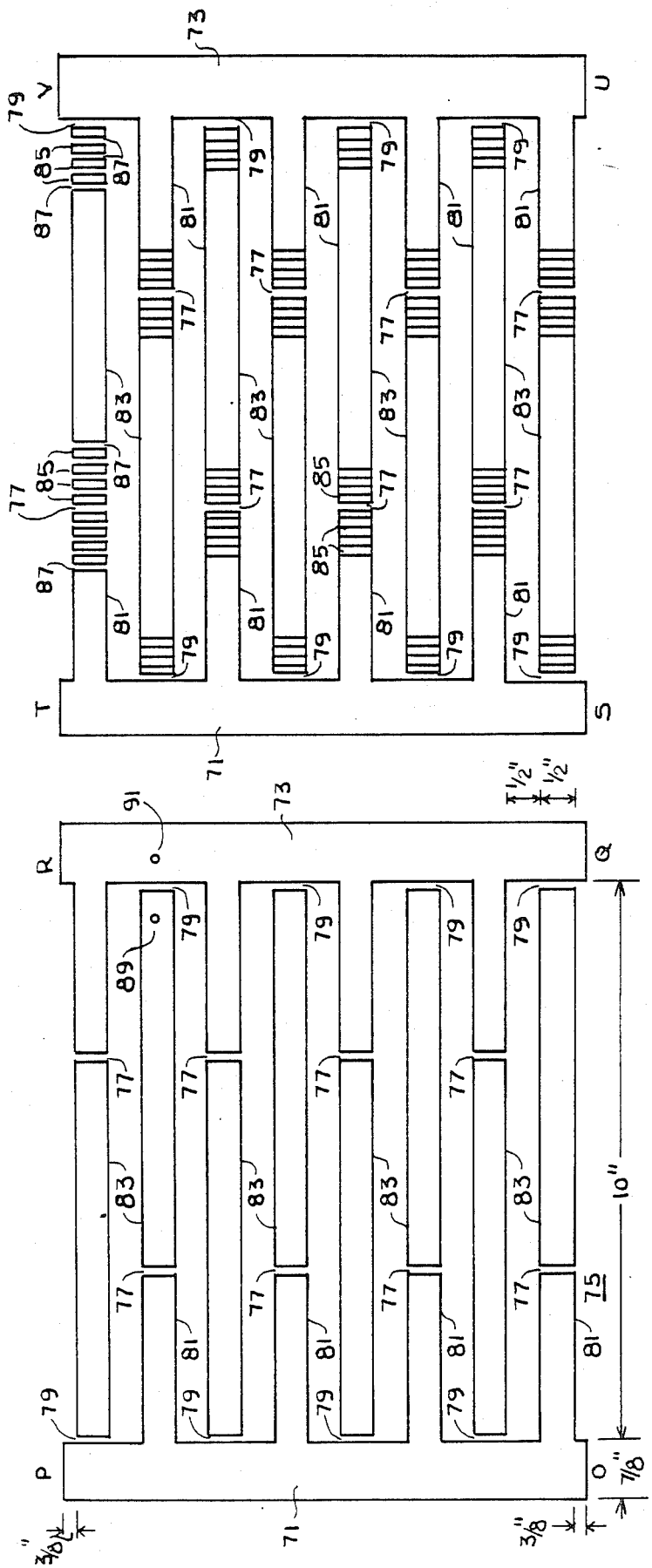

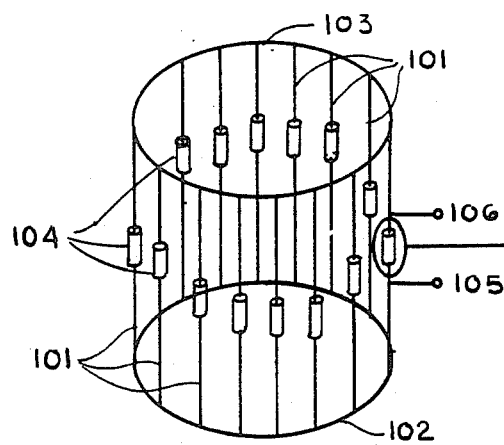
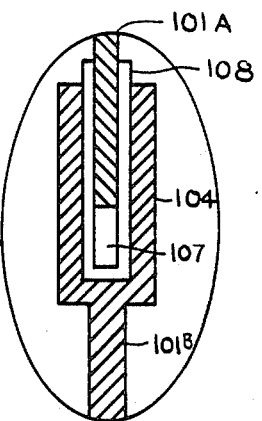
FIG 8A
FIG 8B
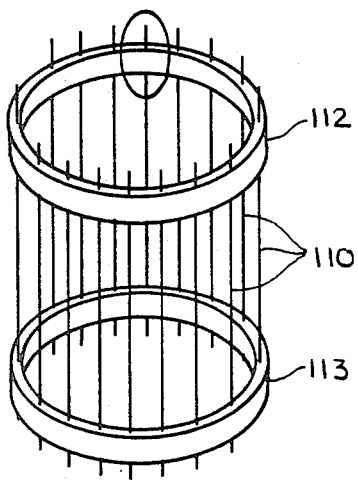
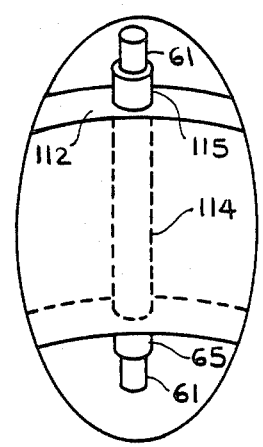
FIG. 9A
FIG. 9B
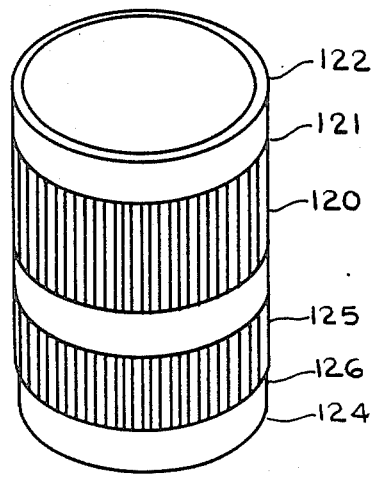
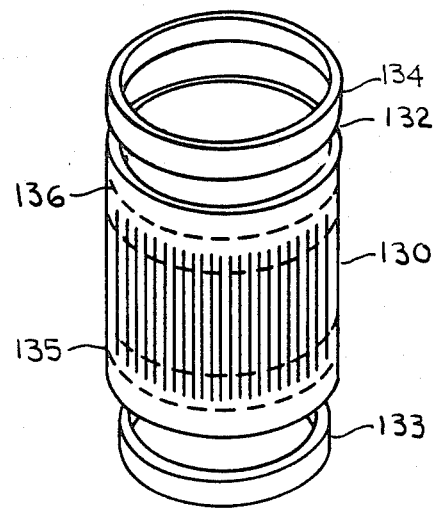
FIG. 10
FIG. 11

RADIO FREQUENCY FIELD COIL FOR NMR

BACKGROUND OF THE INVENTION

This invention relates to nuclear magnetic resonance (NMR) apparatus. More specifically, this invention relates to radio frequency (RF) coils useful with such apparatus for transmitting and/or receiving RF signals.

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons and/or neutrons. Due to the spin of the protons and neutrons, each such nucleus exhibits a magnetic moment, such that, when a sample composed of such nuclei is placed in a static, homogeneous magnetic field, $B_o$, a greater number of nuclear-magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor Frequency, is given by the equation $\omega = \gamma B$, in which $\gamma$ is the gyromagnetic ratio (which is constant for each NMR isotope) and wherein B is the magnetic field ($B_o$ plus other fields) acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillating at or near the Larmor frequency. Typically, such magnetic fields designated $B_1$ are applied orthogonal to the direction of magnetization M by means of radio-frequency pulses through a coil connected to radio-frequency-transmitting apparatus. Magnetization M rotates about the direction of the $B_1$ field. In NMR, it is typically desired to apply RF pulses of sufficient magnitude and duration to rotate magnetization M into a plane perpendicular to the direction of the $B_o$ field. This plane is commonly referred to as the transverse plane. Upon cessation of the RF excitation, the nuclear moments rotated into the transverse plane begin to realign with the $B_o$ field by a variety of physical processes. During this realignment process, the nuclear moments emit radio-frequency signals, termed the NMR signals, which are characteristic of the magnetic field and of the particular chemical environment in which the nuclei are situated. The same or a second RF coil may be used to receive the signals emitted from the nuclei. In NMR imaging applications, the NMR signals are observed in the presence of magnetic-field gradients which are utilized to encode spatial information into the NMR signal. This information is later used to reconstruct images of the object studied in a manner well known to those skilled in the art.

In performing whole-body NMR studies, it has been found advantageous to increase the strength of the homogeneous magnetic field $B_o$. This is desirable in the case of proton imaging to improve the signal-to-noise ratio of the NMR signals. In the case of spectroscopy, however, this is a necessity, since some of the chemical species studied (e.g., phosphorus and carbon) are relatively scarce in the body, so that a high magnetic field is necessary in order to detect usable signals. As is evident from the Larmor equation, the increase in magnetic field B is accompanied by a corresponding increase in $\omega$ and, hence, in the resonant frequency of the transmitter and receiver coils. This complicates the design of RF coils which are large enough to accommodate the human body. One source of difficulty is that the RF field generated by the coil must be homogeneous over the body region to be studied. Another complication arises from the intrinsic distributed inductance and capacitance in such large coils which limit the highest frequency at which the coil can be made to resonate.

Presently used coils employ one turn or two turns in parallel to minimize the inductance and increase the resonant frequency. The concentration of the resonant current in so few turns reduces the homogeneity of the $B_1$ field and homogeneity of the sensitivity to signals produced in different parts of the sample region. Moreover, the lack of symmetry between the position of the tuning capacitor and the stray capacitance of the single-turn coil lead to a non-uniform current distribution in the coil and a corresponding reduction in the uniformity of the $B_1$ field and signal sensitivity.

It is, therefore, an object of the invention to provide an RF coil capable of generating a substantially homogeneous $B_1$ field and which has substantially uniform signal sensitivity over the region of interest.

It is another object of the invention to provide an NMR RF coil which is operable at lower RF power and which exhibits an improved signal-to-noise ratio.

It is still another object of the invention to provide an NMR RF coil having current and tuning capacitance distributed in many turns but which has an effective inductance of a single turn.

SUMMARY OF THE INVENTION

In accordance with the invention, an NMR radio-frequency-field coil includes a pair of conductive elements disposed in a spaced-apart relation along a common longitudinal axis. The loop elements are electrically interconnected by a plurality of conductive segments each having at least one reactive element in series therewith. The segments are disposed substantially parallel to the common longitudinal axis. In one embodiment, the segments are spaced along the loop peripheries such that the resulting configuration has four-fold symmetry. In another embodiment the segments are spaced such that the resulting geometry does not have four-fold symmetry.

BRIEF DESCRIPTION OF THE DRAWINGS

The features of the invention believed to be novel are set forth with particularly in the appended claims. The invention itself, however, both as to its organization and method of operation, together with further objects and advantages thereof, may best be understood by reference to the following description taken in conjunction with the accompanying drawings in which:

FIGS. 7A and 7B depict conductive patterns utilized in fabricating the preferred embodiment of the inventive NMR RF coil;

FIG. 8A depicts one embodiment of the inventive NMR RF coil made up of a plurality of vertical rods with a variable capacitor built into each rod;

FIG. 8B shows a cross section of one possible variable capacitor design to be used with the embodiment depicted in FIG. 8A;

FIG. 9A shows another embodiment of the inventive NMR RF coil which is made up of a plurality of vertical rods with fixed capacitors at each end;

FIG. 9B depicts in greater detail capacitor construction utilized with the coil embodiment illustrated in FIG. 9A;

FIG. 10 depicts as yet another embodiment of the inventive NMR RF coil comprised of a plurality of parallel wires shorted together at one end and plated onto the outside surfaces of a telescoping form comprised of dielectric material;

FIG. 11 depicts still another embodiment of the inventive NMR RF coil made up of a plurality of parallel isolated wires which are plated onto the outside surface of a cylinder formed of dielectric material.

DETAILED DESCRIPTION OF THE INVENTION

A solenoidal geometry is frequently utilized in the design of magnets which are used to produce the homogeneous magnetic field $B_o$. The use of this geometry imposes two constraints on the design of RF coils to be used in an NMR imaging system. One of these constraints is that the RF coil should be constructed on the surface of a cylinder so there is free access along the axis of the whole to accommodate the patient ILLIGIBLE constraint is that the radio-frequency field $B_1$ produced by the RF coil must be perpendicular to the solenoidal axis of symmetry which is parallel to the axis of field $B_0$ (typically selected to be in the Z direction of the Cartesian coordinate system).

Figure 1A:
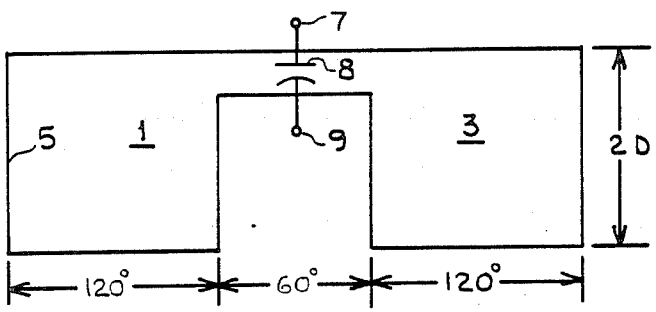
FIG. 1A illustrates in schematic form a conventional, parallel-connected, two-turn NMR RF coil used for whole-body studies.
Figure 1B:
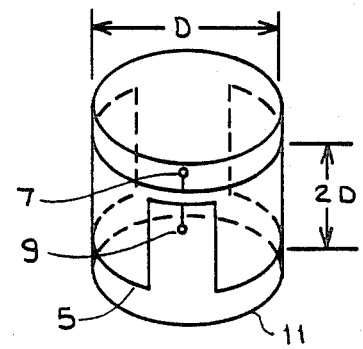
FIG. 1B depicts the coil illustrated in FIG. 1A mounted on a cylindrical form.

FIGS. 1A and 1B depict schematically one conventional NMR coil design. The coil is made up of single turns 1 and 3 connected in parallel and driven at points 7 and 9 across a tuning capacitor 8. Such a coil is typically formed from copper tubing 5 which is mounted on a non-conductive (high dielectric) cylindrical form 11, as seen in FIG. 1B. Each of the coil turns is sized to cover 120° of the cylinder's circumference. The coil region where connections 7 and 9 are made is sized to cover approximately 60° of the circumference. For maximum RF field uniformity, the side of the coils parallel to the longitudinal axis of the cylinder should be equal to two cylinder diameters (D). However, a coil having a side length of two diameters is impractical, because RF energy is placed in regions of the patient which are not of interest. Therefore, in practice, the coil side length is reduced to approximately one diameter length.

Figure 1C:
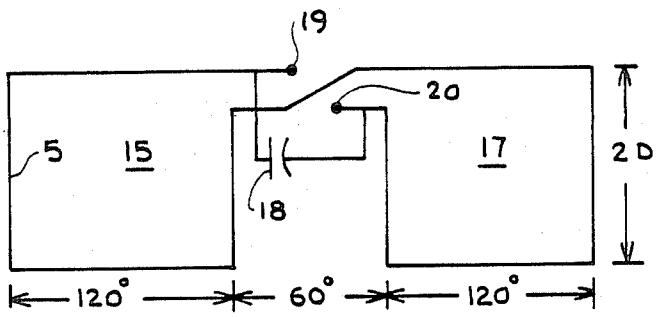
FIG. 1C depicts in schematic form another conventional two-turn, series-connected NMR RF coil used in NMR studies of the head, for example.

FIG. 1C illustrates another embodiment of a conventional RF coil which is similar to that depicted in FIG. 1A, but in which coil turns 15 and 17 are connected in series and driven at points 19 and 21 across a capacitor 18. The coil illustrated in FIG. 1C is typically utilized in NMR studies of the head.

Figure 1D:
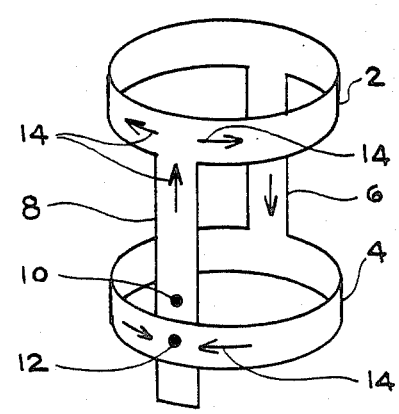
FIG. 1D depicts as yet another conventional NMR RF coil.

FIG. 1D depicts as yet another embodiment of a conventional NMR RF coil made up of two conductive loop elements 2 and 4 fabricated from copper foil. The loop elements are electrically interconnected by a conductive strip 6. A second conductive strip 8 disposed opposite ILLIGIBLE p6 is electrically connected to one of the loops, for example 2, but is separated at its other end by an air space formed between it and loop 6. The coil is energized across the airgap at points 10 and 12. Current flow is as indicated by arrows 14.

RF coils having a single turn or two turns, as described hereinabove, have been used to minimize the inductance and increase the resonant frequency to permit NMR studies to be performed at higher magnetic field strengths. However, as described hereinbefore, the concentration of the resonant current in so few turns reduces the homogeneity of the $B_1$ field and homogeneity of the signal sensitivity in the sample volume undergoing examination. Moreover, the lack of symmetry between the position of the timing capacitor and the stray capacitance of, for example, the single-turn coil leads to a non-uniform current distribution in the coil, and a corresponding reduction in the uniformity of the $B_1$ field. One of the effects of stray capacitance in the low-turn coils (as well as in others) is to cause currents not to circulate through complete coil loops, but to leak through the object undergoing examination. This has the deleterious effect of destroying field uniformity. It will be recognized that increasing the number of series coil turns in an effort to increase homogeneity is not a viable solution, since increased coil turns increase inductance (hence, placing a ceiling on the resonant frequency of the coil).

It is, therefore, apparent that current distribution needs to be controlled in a number of coil windings to produce a uniform $B_1$ field. Additionally, as already indicated hereinbefore, coil geometry should be such that there is free access along its longitudinal axis for positioning a patient. The $B_1$ field must also be perpendicular to the cylindrical axis of symmetry which is selected to be parallel to the direction of the $B_0$ field. The single-turn coil shown in FIG. 2A satisfies these constraints and is the basic element of the coil in accordance with the invention.

Figure 2A:
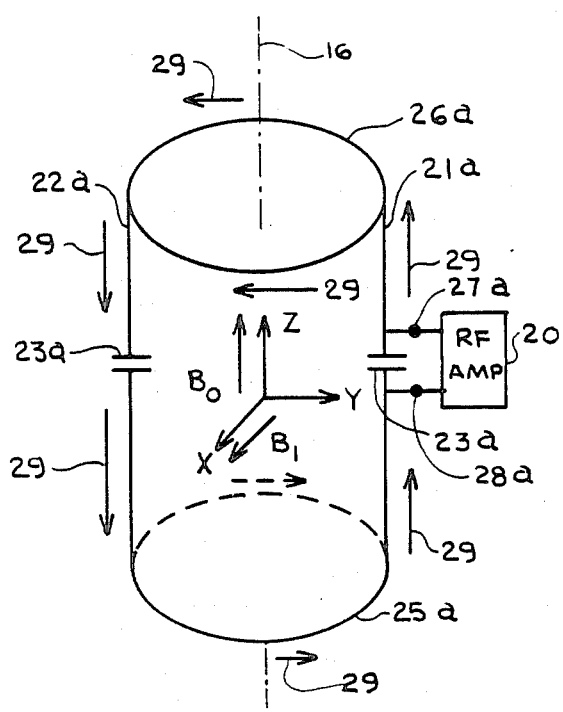
FIG. 2A depicts a single-turn saddle coil which forms the basic element of the coil constructed in accordance with the invention.

Referring now to FIG. 2A, the single turn coil is comprised of two parallel conductive segments 21a and 22a each having a capacitor 23a connected in series therewith. The ends of conductors 21a and 22a are connected to diametrically opposed points on a pair of parallel conductive loops 25a and 26a spaced apart along common longitudinal axis 16. The coil could be driven by a source such as an RF amplifier generally designated 20 connected between terminals 27a and 28a in parallel with the capacitor in segment 21a. Arrows 29 indicate the relevant current paths which produce a $B_1$ radio-frequency field perpendicular to the plane defined by conductive wire segments 21a and 22a which, for convenience, will be hereinafter referred to as being vertical. It should be noted that the direction of the $B_1$ field may be determined by the conventional right-hand rule. The rule states that, if the fingers of the right hand are placed around the current-carrying segment so the thumb points in the direction of current flow, the fingers will point in the direction of the magnetic field (i.e., $B_1$).

Figure 2B:
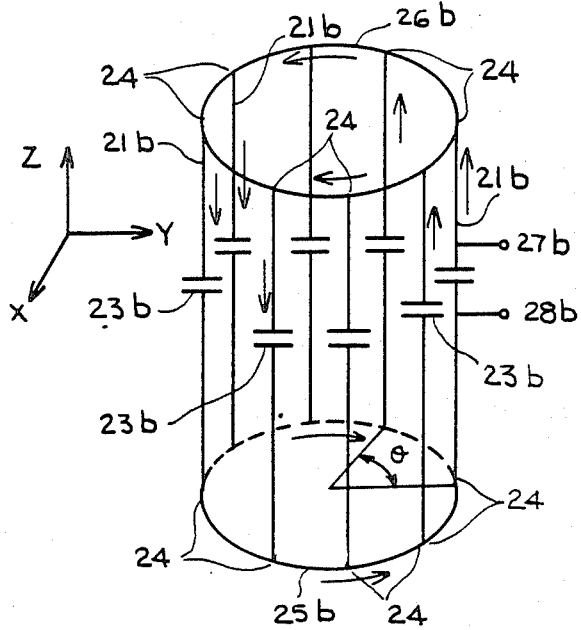
FIG. 2B depicts schematically the inventive NMR RF coil.

The NMR coil design in accordance with the invention is comprised in the preferred embodiment of a plurality of vertical wire segments 21b evenly spaced and connected around the upper and lower conductive circular loops 25b and 26b as shown in FIG. 2B. It will be recognized that the loops need not be precisely circular but may also be elipsoidal or of some other geometrical form generally having an opening therein to accommodate the object to be examined. Each of the vertical conductive segments includes at least one capacitive element 23b. The multiple current paths, each equivalent to that in FIG. 2A, are indicated by arrows 29 in FIG. 2B, and will be discussed in greater detail hereinafter. The homogeneity of the $B_1$ field increases as the number of vertical conductive segments is increased. This is due to the fact that, as the number of segments is increased, the resultant field is produced by many contributions so that the effect of any one conductor is reduced. The number of conductors cannot be increased without limit since the open spaces between adjacent vertical conductors are needed to allow a path for the magnetic flux, due to current flow, to escape thereby producing a homogeneous $B_1$ field. Coils having 4, 8, 16, and 32 vertical conductors have been constructed. It should be noted that the vertical conductive segments need not be evenly spaced. In fact, an embodiment of the inventive RF coil having a window formed therein to facilitate observation of the patient is disclosed hereinafter. What is needed to produce a homogeneous $B_1$ field is a plurality of vertical conductors distributed around the periphery of the conductive loops such that the current in the vertical conductors approximates a sinusoidal distribution. The resulting inventive NMR coil may be thought of as a resonant cavity made up of an open-ended cylinder with an oscillating magnetic field transverse to the cylinder's axis when the coil is excited by a sinusoidal voltage or current source. There are a number of resonant modes possible, as will be more fully described hereinafter.

Figure 3A:
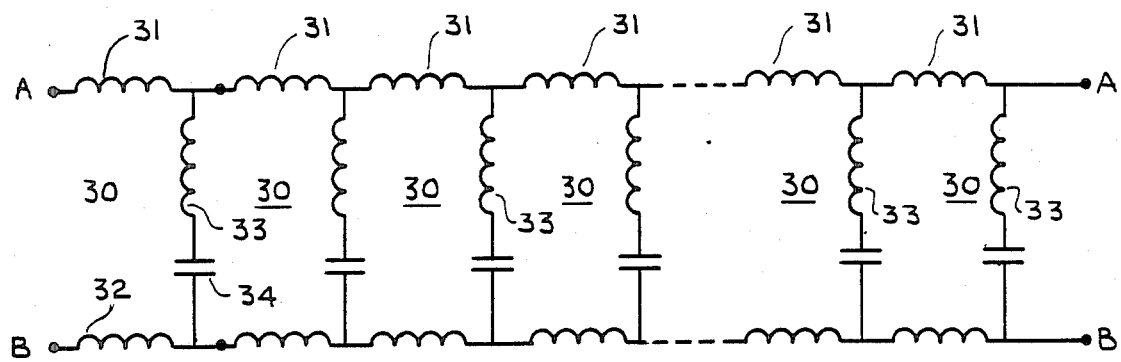
FIG. 3A is a lumped-element equivalent circuit of the inventive NMR RF coil.

A better understanding of the inventive coil depicted schematically in FIG. 2B can be acquired by study of the lumped-element-equivalent circuit for this coil configuration as shown in FIG. 3A. The equivalent circuit is a balanced-ladder network made up of a repeat circuit unit depicted in FIG. 3B and generally designated 30. Each unit is comprised of inductive elements 31 and 32, each having connected at one of the ends thereof a series-connected combination of inductive and capacitive elements 33 and 34, respectively. The two points labelled A (FIG. 3A) are joined together to complete the upper conductive loop 26b, and the points labelled B are joined to complete the lower conductive loop 25b. Inductors 31 and 32 represent the inductance associated with each loop segment 24 along the upper and lower conductive loops of the coil. These inductors are all mutually inductively coupled. Likewise, inductors 33 associated with vertical wire segments 21b are all mutually inductively coupled. To some extent, the vertical wire segments appear to be wired in parallel with a resulting reduced net inductance compared to the single-turn version shown in FIG. 2A. On the other hand, the mutual coupling increases the net inductance of the upper and lower conducting loops (compared to the sum of the individual self inductances in the loops). In practice, the loop and vertical segment inductances can be minimized by constructing both from a wide band of conducting foil. This may be advantageously accomplished by etching the conductors using a flexible printed circuit board. It may be desirable, for example, to minimize inductances 31, 32, and 33 (FIG. 3A) to raise the operating frequency of the coil.

Figure 3B:
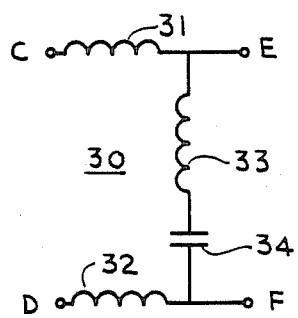
FIG. 3B is a repeat circuit unit, a plurality of which form the circuit shown in FIG. 3A.

Referring now to FIG. 3B, in operation, the voltage between points E and F is phase shifted with respect to the voltage between points C and D. At the frequency where the cumulative phase shift for all units 30 (FIG. 3A) adds to $2\pi$ radians, the coil has a standing wave resonance. At this resonance, referred to as the primary resonance, the current in each vertical wire segment 21b has been found to be approximately proportional to $\sin\theta$, where $\theta$ (see FIG. 2B) is the polar angle of the vertical wire segment measured from the Y axis, for example. Such sinusoidal current distribution produces an increasingly more homogenous transverse field as the number of vertical wire segments 21b is increased.

The coil configuration represented by the lumped-element equivalent circuit of FIG. 3a can also exhibit higher frequency resonances which produce higher order transverse field distributions. The higher resonance frequencies are excited by using an appropriately higher frequency excitation source. These resonances will be referred to as secondary resonances. For example, when the cumulative phase shift around the network equals $4\pi$ radians, the current in the vertical wire segments is proportional to $\sin 2\pi$. For this resonance, the X and Y components of the transverse field show an approximately linear gradient along the X and Y axes, respectively, with nulls at the center of the coil.

It is not known whether the particular set of equations describing the lumped-element-equivalent network circuit of FIG. 3a has been solved analytically. However, wave propagation in periodic structures has been studied extensively, particularly in solid-state physics, and provides support for the intuitive description of the current distributions in the lumped-element-equivalent circuit. Connecting the ends (A and B, FIG. 3a) of the ladder to produce upper and lower loops imposes periodic boundary conditions which are also often used in crystal lattice theory. For 2N repeat elements 30, there are 2N+1 loop currents and 2N+10linear equations. One loop current can be set equal to zero provided the current in loops 25b and 26b are balanced. The 2N remaining equations can be represented by a 2N×2N Toeplitz matrix which has N pairs of eigensolutions. The eigen currents are proportional to $\sin n\theta$ and $\cos n\theta$ with $1 \leq n \leq N$. Numerical solutions of the equations indicate that the currents are sinusoidal.

Figure 4:
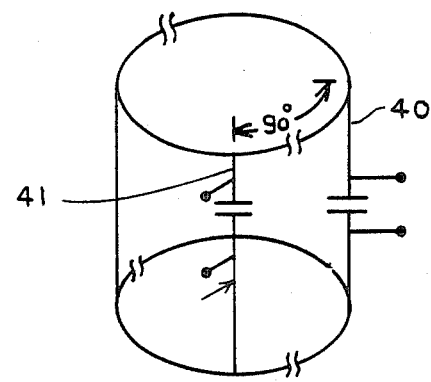
FIG. 4 depicts an embodiment of the inventive NMR RF coil capable of being driven at two points.

Several advantages are realized if the coil is constructed to have four-fold cylindrical symmetry. As used herein, four-fold cylindrical symmetry means that coil geometry (i.e., the position of vertical segments along loop periphery and the capacitive values in each segment) remains the same when the coil is rotated by 90° about its longitudinal axis. For example, coils having a number of vertical segments which is a multiple of four (e.g., 4, 8, 12, 16, 32) have four-fold symmetry. In this case, the primary resonance has two orthogonal degenerate modes at the same resonant frequency. One mode, referred to herein as the X mode, gives an RF magnetic field parallel to the X axis when the current in the vertical wires is proportional to $\sin\theta$. For the other mode, referred to as the Y mode, current is proportional to $\cos\theta$ and the magnetic field is in the Y-axis direction. If the RF coil is driven by applying power from an RF amplifier (not shown) at a single point, such as between terminals 27b and 28b depicted in FIG. 2b, only the X mode is excited. The resonant circuit in this case produces an oscillating RF field $2H_1 \cos \omega t$, which can be thought of as two fields, each $H_1$ in magnitude, rotating in opposite directions in the transverse plane perpendicular to the direction of the $B_o$ field. The nuclei respond to only one of the two rotating fields. Specifically, the nuclei respond to the field rotating in the direction in which the polarized nuclei precess. Hence, the power used to create the $B_1$ component rotating in the wrong direction is wasted. However, if as shown in FIG. 4, the coil is powered at a second drive point in vertical conductor 41 located 90° from the first driving point in vertical conductor 40 with a source 90° out of phase, the two oscillating fields add vectorially to give a single rotating field. In this case, no driving power would be wasted. Hence, driving the inventive RF coil at two driving points separated by 90° doubles the RF power efficiency. Also, because the noise voltage generated in the two orthogonal modes are not correlated but the signals from the nuclei are correlated, the signal-to-noise ratio can be enhanced by a factor of the $\sqrt{2}$. In this case, the detected NMR signal must be sampled at the two orthogonal points of the coil.

The need to maintain orthogonality for the two degenerate X- and Y-resonant modes places constraints on component tolerances and coil geometry. For example, the effective coefficient of inductive coupling, K, between the two modes must be kept small compared to the reciprocal of the coil, quality factor Q. At high frequencies, where patient loading of the coil is high and increased RF power eficiency is more desirable, a lower Q of the coil relaxes somewhat the constrains on achieving orthogonality. The two resonance modes are substantially uncoupled if the product $K \times Q$ is less than about 5%. In this case, each mode will have the correct phase shift to produce a rotating field.

Figure 5A:
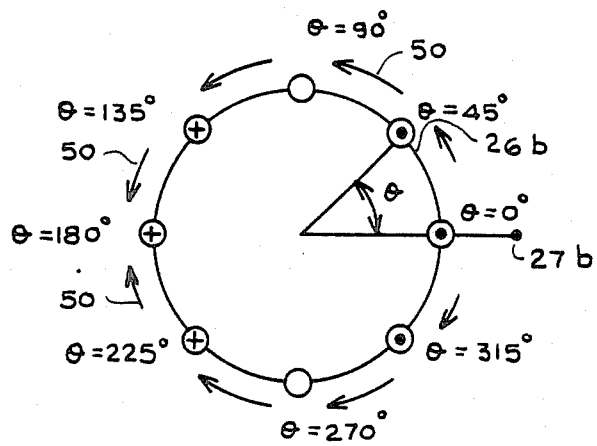
FIG. 5A depicts a top view of an inventive NMR RF coil illustrating current direction in the conductive loop element.
Figure 5B:
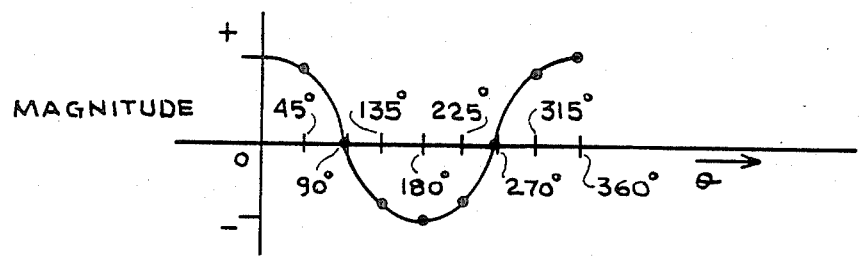
FIG. 5B depicts the sinusoidal current distribution in the vertical segments of the coil depicted in FIG. 5A.
Figure 5C:
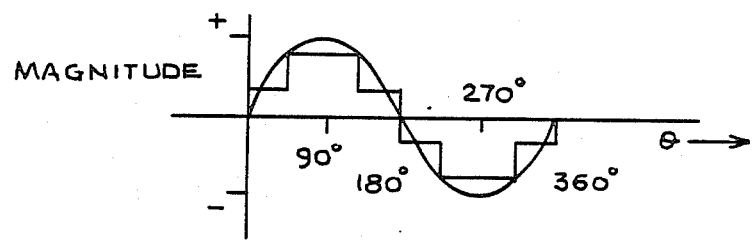
FIG. 5C depicts the current distribution in the conductive loop element of the coil depicted in FIG. 5A.

The directions of currents in vertical and loop conductors for a coil having eight vertical conductors, and hence four-fold symmetry, are indicated by arrows 29 in FIG. 2B which depicts such a coil. The current directions are for the primary (desired) resonance mode. The sinusoidal nature of these currents will now be discussed in greater detail with reference to FIGS. 5A–5C. Referring now to FIG. 5A, there is shown a top view of the coil depicted in FIG. 2B. The coil is energized at points 27b and 28b, as before, which are in a segment arbitrarily assigned to a position $\theta=0°$. With the coil energized in this manner, the maximum current proportional to $\cos \theta$ flows in the segment located at $\theta=0°$ in a direction out of the paper plane as suggested by the circled dot. Smaller currents (proportional to $\cos \theta$, wherein $\theta=45°$ and 315°) flow in the same direction in the segments adjacent the one situated at $\theta=0°$. Currents of corresponding magnitude flow in an opposite direction (into the paper, as indicated by the circled cross) in the segments situated at $\theta=180°$, 135°, and 225°. The magnitude of current flow in the conductive segments is graphically depicted in FIG. 5B, in which position angle $\theta$ is indicated along the horizontal axis, while current magnitude is indicated along the vertical axis. Currents flowing out of the paper (45°, 0°, 315°) have been arbitrarily designated as having positive values, while those flowing into the paper (135°, 180°, 225°) have negative values. In the primary resonant mode, the segments at $\theta=90°$ and $\theta=270°$ do not conduct any current and in practice may be eliminated or replaced by short circuits.

The direction of current flow in upper conductive loop 26b (FIG. 5A) is indicated by arrows 50 which are sized relative to one another to indicate approximate magnitudes. More precisely, loop current distribution is graphically depicted in FIG. 5C with angular position and current magnitude being indicated along horizontal and vertical axes, respectively, and wherein clockwise current flow is arbitrarily assigned to have a positive value. The loop currents are distributed in a step-wise manner. Thus, currents flowing between 45° and 90°, and between 315° and 270° are larger than those between 0° and 45°, and between 0° and 315°, respectively, since the former include currents provided by segments at 45° and 315°.

Figures 5D, 5E:
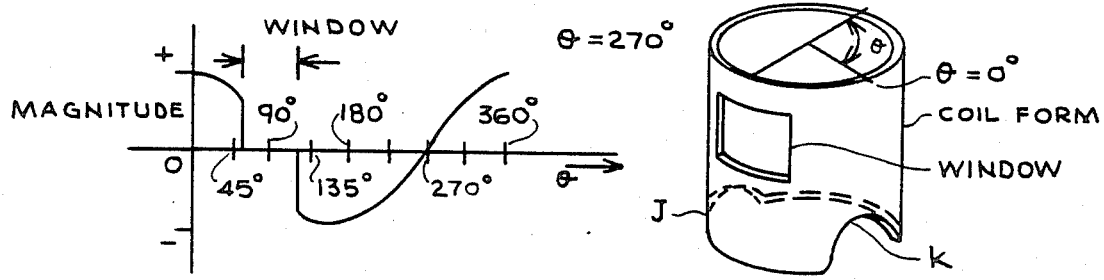
FIG. 5D illustrates an inventive NMR RF coil having a window formed therein and including a deformed conductive loop lement.
FIG. 5E depicts the current distribution in the vertical segments for the inventive coil depicted in FIG. 5D having some segments removed.

In some coil embodiments (see FIG. 5D), particularly those used for NMR imaging of the head, it has been found advantageous to cut a window in the coil form to provide ready means for the patient face to be visible. This has necessitated the removal of some of the vertical segments to provide an unobstructed area in which to cut the window. This is especially true of coils having closely spaced vertical segments, such as the 32 segments in an embodiment disclosed hereinafter. To minimize the perturbation of RF field homogeneity, it has been found desirable to remove those segments which carry little or no current. In the embodiment shown in FIG. 5A, either one of the conductors situated at 90° or 270° could be removed without significantly affecting field homogeneity. The current distribution in the vertical segments in the case where the segment at 90° is removed is graphically in FIG. 5E. The current magnitude at points greater than 45° and less than 135° is zero.

In the embodiment having 32 vertical segments, six segments were removed to accommodate the window. The coil was found to work satisfactorily without any adjustment. In the preferred embodiment, however, it has proven advantageous to increase the capacitance values in the segments nearest the window on either side to accommodate increased currents therein to compensate for the eliminated current-carrying capacity of the removed segments.

In some head coil embodiments, it may also be desirable to bend one of the loop elements into a generally saddle-shaped configuration. The raised loop sections (J and K in FIG. 5D) fit over the shoulders allowing the head to be more fully enclosed by the coil.

Figure 6A:
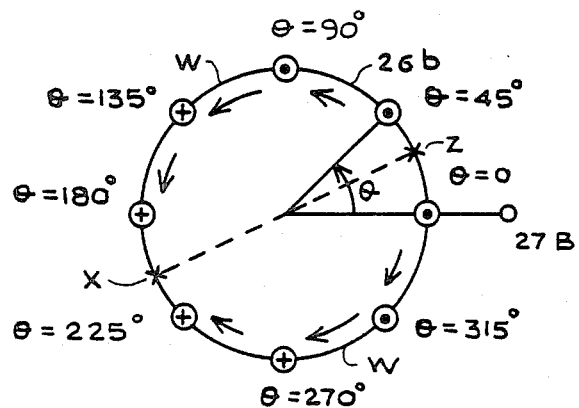
FIGS. 6A–6C are similar to FIGS. 5A, 5B, and 5C respectively, and depict an inventive NMR RF coil, and currents associated therewith, having open circuits formed in the loop elements thereof.
Figure 6B:
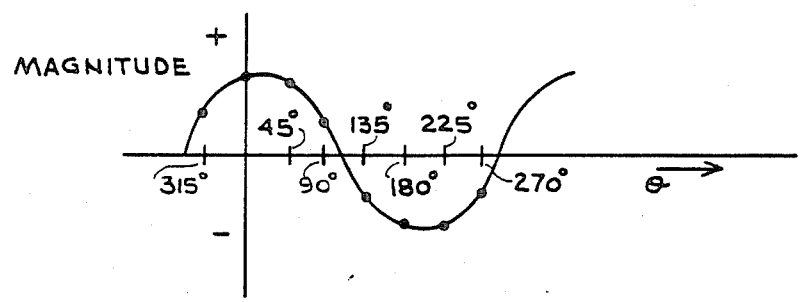
Figure 6C:
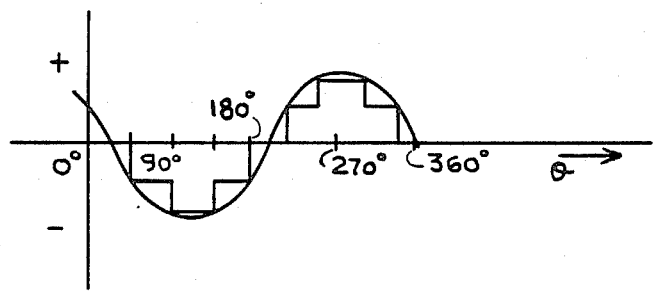

It has also been found advantageous in the case of NMR head coils to fabricate the inventive coil on two separable coil assemblies as claimed and disclosed in commonly assigned co-pending application Ser. No. (15-NM-2442), which is incorporated herein by reference as background material. In this case, it is necessary to form open circuits in the upper and lower loop conductors at points X and Z as indicated in FIG. 6A. The coil is still energized at a point $\theta = 0$, such that in operation the two coil halves resulting from the open circuits are coupled by mutual inductance to operate as a single coil. FIG. 6A is similar to FIG. 5A, with the exceptions that, due to the loop open circuits, segments at 90° and 270° carry oppositely directed currents. The segment current distribution for this embodiment is depicted in FIG. 6B, and, as before, has a sinusoidal geometry dependent on angle $\theta$ with maximum current occuring in segments near $\theta = 0°$, 45°, 180°, and $\theta = 225°$, FIG. 6C depicts the current distribution in the conductive loop elements. Maximum loop current values occur at values of $\theta$ slightly greater than 90° and 270° at points designated W.

If desired, a window may be formed in the coil embodiment depicted in FIG. 6A, by removing conductive segments carrying the lowest currents. Such segments are located between 90° and 135°, and 270° and 315° as indicated by regions designated W in FIG. 6A. Reference to FIG. 6B will indicate that these regions correspond to segments having the lowest currents and, therefore, would have the least impact on RF field homogeneity.

If the coil geometry (i.e., either the location of vertical segments along the loop periphery or the capacitance values of the capacitors in each segment) is selected to have other than four-fold symmetry, the X- and Y-resonant modes are orthogonal and occur at different frequencies. One method of exciting the two resonances is with two sources, as described hereinbefore. It is, however, possible to excite two resonances using a single source having the needed frequency components. Small variations in component value or coil geometry may give two overlapping resonances if the coil Q is high enough. This may be troublesome if only a single resonance is desired. One of the two resonances may be sufficiently displaced, however, in frequency to render it harmless if the coil symmetry is grossly perturbed. One possibility is to cut the upper and lower conductive rings $25b$ and $26b$ (FIG. 2b) at the points where the desired mode has current nulls. Another possibility is to replace those capacitors $23b$ which carry no current in the desired mode by short or open circuits. A short-circuited segment in effect appears as a large capacitance and therefore tends to lower the resonant frequency of the undesired mode. The effect of an open circuit is to decrease the apparent capacitance to thereby increase the resonant frequency.

It may be advantageous in the non-four-fold symmetrical coil to manipulate the two resonant frequencies by proper choice of capacitors $23b$. The X mode has maximum currents where the Y mode has minimum current. Hence, by increasing the capacitor values where sin $\theta$ is large and decreasing the capacitors where cos $\theta$ is large, the X-mode frequency can be lowered and the Y-mode frequency raised. Such a coil would be useful for performing simultaneous NMR double resonance studies. For example, one mode could be timed for the proton [1] H resonance and the other mode for the fluorine [19] F resonance.

There are a number of ways that the inventive NMR coil design in principle can be implemented for in vivo NMR studies. In the preferred embodiment, the conductive elements (e.g., $21b$, $25b$ and $26b$, FIG. $2b$) are constructed with wide sheets of conductive foil in order to minimize their self inductance. They also could be constructed with large diameter conductive tubing, for example. The distance between the upper and lower conductive rings should be about one or more times the coil diameter to reduce field inhomogeneity due to the currents in loops $25b$ and $26b$.

If a coil is required to resonate at a single predetermined frequency, it is possible to construct a coil patterned after FIG. $2b$ using only fixed capacitors. It is, however, more practical to include some variable elements for fine tuning the resonant frequency. The minimum requirement for tuning both X and Y modes is to place a variable trimming capacitor in each of two vertical conductive elements located 90° apart (e.g., 40 and 41, FIG. 4). Small perturbations on the capacitance at these two points will not greatly disturb the field homogeneity.

Where a wider adjustment of resonant frequency is desired, it is preferable to tune all of the capacitors simultaneously or to change the effective inductance of the coil assembly. Small variations in inductance can be achieved by varying the width of foil-conductive elements. Larger variations in inductance can be achieved by varying the lengths of the vertical conductors by adjusting the distance between the two conductive loops.

The manner in which the preferred embodiment of an inventive coil having 32 segments and which was physically and electrically sized for NMR head studies will now be described with reference to FIGS. 7A and 7B. The same construction method is utilized in the construction of body coils which are typically sized to have a larger diameter. The head coil was operable at a frequency of 21.31 MHz, which is determined by the strength of main field $B_o$, and the NMR isotope studied. In general, the coil is fabricated by etching (using conventional techniques) four double-sided copper-clad Teflon resin printed circuit boards. The boards are mounted on a cylindrical form having a 10.5 inch outside diameter. Each side of the circuit boards is etched with a different conductive pattern. Each circuit board is approximately 8 by 12 inches.

Referring now to FIG. 7A there is shown the conductive pattern utilized for etching the side of the circuit board (referred to hereinafter as the inside etched surface) which is mounted on the cylindrical form. Wide strips 71 and 73, each seven-eights inch wide, form one quarter of the length of the conductive loop elements. There are eight straight conductive elements, generally designated 75, each approximately ten inches long and one-half inch wide, extending between loop elements 71 and 73. The straight elements are separated by one-half inch wide blank areas where the copper is to be etched away. The straight elements are offset from the ends of loop elements 71 and 73 by approximately three-eights inch. Adjacent ones of straight elements 75 have a gap 77 formed therein to leave, alternately, one third of the element (designated 81) connected to loop elements 71 and 73. A second gap 79 is provided in each straight element to separate the remaining two thirds (designated 83) of the straight element from the corresponding loop element. In this manner, a pattern is formed in which each straight element is made up of a connected one third of the element and an unconnected two thirds of the element. In adjacent straight conductors, the unconnected element 83 is coextensive with the connected one third and extends beyond gap 77 to be coextensive with a one third of the unconnected element in the adjacent straight conductor.

The other pattern is depicted in FIG. 7B and will be referred to herein as the outside etched surface. This pattern is a mirror image of the pattern depicted in FIG. 7A and is sized to have the same dimensions. The pattern of FIG. 7B differs from that of FIG. 7A in that straight conductor portions 81 and 83 are each provided with typically four (although more or fewer could be used) copper pads 85 by etching away narrow gaps.

The inner and outer etched surfaces are overlayed such that points S, T, U, V (FIG. 7A) lie above points O, P, Q, R (FIG. 7B), respectively. In this manner, gaps 77 on each etched (inner and outer) surface are bridged by continous portions of the unconnected two-thirds 83 of the straight elements 75 on each surface. Gaps 79 are bridged by continous portions 81 of the straight element. The combination of cooper foil segments and printed circuit dielectric form three series connected capacitors along the length of each straight conductor. The number of capacitors can be varied by increasing or decreasing the number of gaps. The net capacitance in each straight conductor is typically adjusted to be approximately equal. The adjustment is accomplished by electrically connecting one or more of copper pads 85 to change the area of the overlap of the inner and outer surfaces. In the preferred embodiment, the inner and outer patterns are etched on opposite sides of a double-sided printed circuit board.

The inner and outer etched surfaces of strips 71 and 73 are electrically connected together at points O and S, P and T, Q and U, and R and V. A complete coil requires four such overlayed and interconnected assemblies. A half of the coil is made by electrically joining two assemblies. Points O and Q of one quarter assembly are electrically connected to points P and R, respectively, of the second quarter assembly. The two coil halves constructed in this manner are mounted on a cylindrical coil form without electrical connections between them. Leaving the two halves of the loop conductors disconnected splits the degencracy of the two desired resonances, as disclosed hereinbefore. The two coil halves are coupled, in operation, by the mutual inductances thereof when one of the halves is energized across one of the three capacitors in a straight conductor, such as, for example, at points 89 and 91 shown in FIG. 7A. The drive point impedance was about 50 ohms without any adjustment with a patient's head positioned in the coil (i.e., with a loaded coil).

In the preferred embodiment, the double-sided printed circuit board dielectric (Teflon resin) thickness was about 0.006". Each of the three capacitors in each straight conductor was adjusted to equal approximately 133 pico farads. It should be noted that it is not important that each capacitor have equal value, but only that the net capacitance of each straight conductor are equal. The desired resonance frequency with a homogeneous RF magnetic field was at 21.31 MHz.

Another embodiment of an inventive NMR coil was constructed following the patterns disclosed with reference to FIGS. 7A and 7B and having 32 vertical segments. This coil was constructed on a cylindrical form having an outside diameter of 11.5 inches and a length of 16.5 inches. Strip elements 71 and 73 (FIGS. 7A and 7B) were 0.25 of an inch wide. Straight conductors 75 were 0.5 of an inch wide spaced at five-eights inch intervals. In this case, there were ten gaps in each straight conductor, similar to gaps 77 and 79, so that the value of each capacitor was lower than that in the embodiment of FIGS. 7A and 7B. The coil resonant frequency was 63.86 MHz.

It will be, of course, realized that the above-disclosed construction for the inventive concept is merely the preferred embodiment, and that in fact there are other methods of construction which may be advantageously employed by persons skilled in the art. Some exemplary construction methods will be disclosed next with reference to FIGS. 8A and 8B, FIGS. 9A and 9B, and FIGS. 10 and 11.

FIG. 8A depicts one coil embodiment comprised of a plurality of vertical conductors 101 equally spaced around the periphery of interconnecting conductive loops 102 and 103. Each of conductors 101 is provided with a variable capacitor 104 built into the lengths thereof. FIG. 8B shows a detailed longitudinal section of one variable capacitor illustrating one possible construction. The capacitor is formed of an inner conductor portion 101a, one end of which extends into a hollow portion 107 of conductor section 101b. The other ends of conductors 101a and 101b are connected to conductive loops 102 and 103. Portion 101a is separated from the inner surface of the hollow section of conductor 101b by means of a sleeve formed of a dielectric material 108 which may comprise quartz or another suitable dielectric material, such as Teflon synthetic resin polymer. A typical number of vertical conductors 101 and, hence, capacitors 104, may be selected (but is not limited to) to be between 8 and 32. All of the capacitors can be tuned simultaneously by changing the length (or height) of the device. The change in inductance with length is a smaller effect than the change in capacitance. It will be recognized, of course, that each vertical conductor (in either this embodiment or in those described below) need not have a variable capacitance associated therewith, if only a single resonant frequency is desired.

FIGS. 9A and 9B depict another embodiment of the inventive NMR RF coil which is tuned by varying the inductance rather than capacitance. The coil is comprised of a plurality of parallel vertical conductors 110, each having a pair of fixed capacitors at each of the ends thereof. The conductors are evenly spaced about the circumference of a pair of parallel conductive loops 112 and 113 but are electrically insulated therefrom to form a pair of capacitors at the ends. FIG. 9B illustrates in detail the manner in which the capacitors are formed. Each of conductors 110 extends through openings 114 formed in a loop 112, for example. Conductors 110 are electrically insulated from the conductive loop by sleeves 115 made of a dielectric material lining openings 114. The coil is simultaneously tuned by moving one or both of end loops 112 and 113 closer or farther apart. This changes the inductance without changing the capacitance of the coil.

Another embodiment of the inventive NMR RF coil is schematically depicted in FIG. 10. In this embodiment, a plurality of parallel conductors 120, electrically shorted at one of the ends 121 thereof, are plated (or etched) on the outside surface of a dielectric cylindrical form 122. A similar cylindrical form 124 having a slightly smaller diameter than that of form 122 also has plated thereon a plurality of parallel conductors 125 shorted at their ends 126. Cylindrical form 124 having a smaller diameter than that of form 122 is adapted to be slidably inserted thereinto, such that the unshorted ends of conductors 120 and 125 overlap. The capacitance between corresponding matching wires depends on degree of overlap between conductors 120 and 125. The device is tuned either by sliding one form in or out when the wires are aligned (varying the inductance and capacitance) or by rotating one form slightly with respect to the other to misalign the conductors to thereby vary the capacitance.

FIG. 11 depicts as yet another embodiment of the inventive NMR RF coil in which parallel isolated conductors 130 are plated onto the outside surface of a dieloctric cylindrical form 132. A pair of conductive loops 133, 134 are then inserted into each of the ends of the cylindrical form to a position designated by the dotted lines 135 and 136, such that each loop couples capacitively to the wires through the dielectric material comprising the cylinder walls. Moving the loops in or out along the longitudinal axis of the cylinder tunes the device by varying the degree of overlap between the loop and the conductors and thereby varies the capacitance. The device may also be tuned inductively by sliding at least one of the loops so as to vary the length of vertical conductors 130. It will be recognized that conductors 130 could be positioned on the inside of the cylindrical form while the conductive loops would be inserted onto the outside of the cylinder.

In each of the above-described exemplary NMR coil embodiments, the tuning is accomplished by varying the degree of overlap or relative length of the conductive coil elements. The relative motion necessary to vary the degree of coupling or the conductor length occurs at capacitive coupling points. Hence, there is no contact resistance to create noise or losses.

Figure 12:
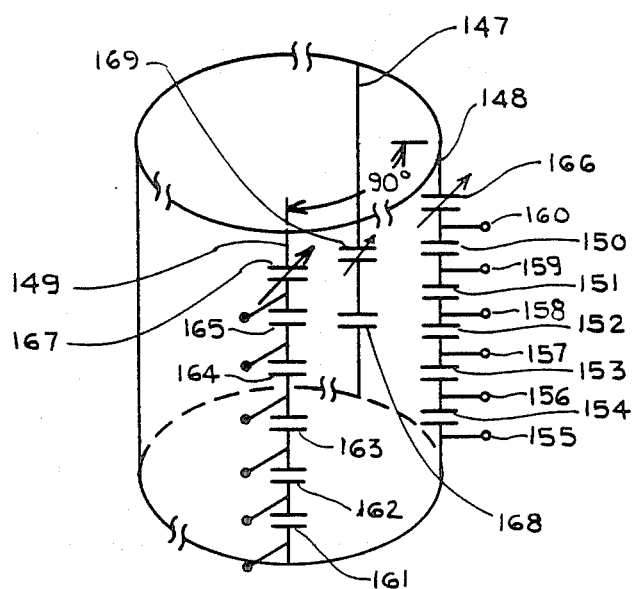
FIG. 12 is a partial schematic illustration of the inventive NMR RF coil in which selected ones of the vertical wires are provided with a plurality of fixed capacitors which may be utilized for impedance matching.

It will also be recognized that it is desirable for efficient power transfer to have matching coil input and transmitter output inpedances. In the inventive NMR coil configuration, this may be accomplished by providing a plurality of series-connected capacitances, such as capacitances 150–154, in a vertical conductor 148, as shown in FIG. 12. In this case, an appropriate pair of terminals 155–160 providing the desired impedance is selected as needed to provide the best match to the transmitter impedance. When two driving points are used to energize the coil, similar series capacitances 161–165 may be utilized in the second vertical conductor 149 which is perpendicular to the first driven conductor. In this case, variable capacitances 166 and 167 in conductors 148 and 149, respectively, are utilized to fine tune the coil. In those vertical conductors which are not used as driving points, the capacitance needed to resonate the circuit need not be distributed in a string of series-connected capacitors, but may instead be lumped into a single capacitance 168 shown in FIG. 12 as being connected in a vertical conductor 147, which may also include a variable tuning capacitor 169. As in the case of FIG. 4, some of the vertical conductors in FIG. 12 are not shown to preserve clarity.

From the foregoing, it will be appreciated that, in accordance with the invention, an NMR RF coil is provided in which the current and tuning capacitance are distributed in many turns, but in which the effective inductance is approximately equal to or less than that of a single-turn coil. The inventive NMR RF coil also provides a considerable improvement in the uniformity of the $B_1$ field and in signal sensitivity. The coil's geometry also permits improvements in signal-to-noise ratio and reduction in RF driving power.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

I claim:

1. An NMR radio-frequency (RF) coil comprising:
   a pair of conductive loop elements disposed in a spaced apart relation along a common longitudinal axis; and
   a plurality of conductive segments each having at least one reactive element in series therewith, said segments electrically interconnecting said loop elements at points spaced along the periphery of each of said loops, said segments being disposed substantially parallel to said longitudinal axis such that the resulting configuration has four-fold symmetry, wherein in operation said RF coil is capable of producing an RF field useful for performing NMR studies.

2. The NMR RF coil of claim 1 wherein said conductive segments are spaced at equal intervals along the periphery of each of said loops.

3. The NMR RF coil of claim 1 or 2 wherein said reactive element comprises at least one capacitive element.

4. The NMR RF coil of claim 3 wherein said coil is energizable across at least one of said capacitive elements in one of said conductive segments to achieve in operation a current in said segments approximating a sinusoidal distribution dependent on the segment angular position $\theta$ along the loop peripheries.

5. The NMR RF coil of claim 3 wherein said coil is energizable by a first source connected in parallel with one of said capacitive elements in a first one of said segments so as to excite said RF coil to produce an oscillating RF field perpendicular to said longitudinal axis and described by $2H_1 \cos \omega t$, in which $H_1$ is the magnitude of the oscillating RF field,
$\omega$ is the resonant frequency of the RF field,
$t$ is time, said RF field being made up of two component rotating in opposite directions.

6. The NMR RF coil of claim 5 wherein said coil is energizable by a second source 90° out of phase with said first source, said second source being connected in parallel with a capacitive element in a second one of said segments separated by an angle $\theta = 90°$ from said first segment such that said orthogonal RF field components add vectorially to produce a single rotating RF field wherein $\theta$ is a polar angle indicative of the position of each of said segments along the periphery of said loops.

7. The NMR RF coil of claim 3 wherein each of said segments comprises first and second sections, said sections being connected at one end to a respective one of said loop elements, the other end of said first sections having formed therein a recess for slidably receiving the other end of a corresponding one of said second sections, said other ends of said first and second sections being separated by a dielectric material, said segments being moveable relative to one another thereby to form a variable capacitive element.

8. The NMR RF coil of claim 3 comprising a first and second hollow cylindrical form of dielectric material, said forms being sized for telescoping movement relative to one another, said segments being composed of first and second sections supported by a major surface of said first and second forms, respectively, said first and second conductor sections being connected at one of the ends thereof to a respective one of said loop elements, the other ends of matching ones of first and second sections being positioned to overlap one another so as to form a capacitive element, the degree of overlap therebetween being adjustable by relative movement of said forms.

9. The NMR RF coil of claim 3 comprising:
a hollow cylindrical form of dielectric material, said segments being supported by a major surface thereof parallel to said longitudinal axis; and
said pair of conductive elements being disposed on a surface opposite to the surface of said form supporting said segments to form a capacitive element in the region of overlap between said loops and said segments, at least one of said loop elements being slidably disposed on said form so as to vary the region of overlap thereby to vary the capacitance of said capacitive element.

10. The NMR RF coil of claim 3 wherein at least one of said conductive loop elements includes a plurality of spaced apertures formed around the periphery thereof for slidably receiving corresponding ones of said segments, said apertures being lined with a dielectric material to electrically insulate said segments from said loop element so as to form fixed-value capacitive elements, the inductance of the coil being adjustable by relative motion of said loop element having apertures formed therein along said segments to vary the length thereof.

11. The NMR RF coil of claim 3 wherein of said segments each includes at least one variable capacitive element.

12. An NMR radio-frequency (RF) coil comprising;
a pair of conductive loops disposed in a spaced-apart relation along a common longitudinal axis; and
a plurality of conductive segments each having at least one capacitive element in series therewith, said segments electrically interconnecting said loop elements at points spaced along the periphery of each of said loops, said segments being disposed substantially parallel to said longitudinal axis resulting in an NMR RF coil having non-four-fold symmetry wherein in operation said RF coil is capable of producing an RF field useful for performing NMR studies.

13. The NMR RF coil of claim 12 wherein said conductive segments are spaced at equal intervals along the periphery of each of said loops.

14. The NMR RF coil of claim 12 wherein said coil comprises an NMR RF head coil and wherein one of said conductive loop elements has a geometry fitable about the shoulders of a subject allowing the head to be more fully positioned within the coil.

15. The NMR RF coil of claim 12 including means allowing said coil to be energized across at least one of said capacitive elements in one of said conductive segments to achieve in operation a current in said segments approximating a sinusoidal distribution dependent on the segment angular position $\theta$ along the loop peripheries.

16. The NMR RF coil of claim 15 wherein said means includes first and second means allowing said RF coil to be energized so as to excite therein first and second orthogonal resonant modes having segment current distribution proportional to $\sin \theta$ and $\cos \theta$, respectively, said capacitive elements in segments where $\sin \theta$ is large having high capacitive values, while said capacitive elements in segments where $\cos \theta$ is large having lower capacitive values relative to said high values such that said first and second modes occur at different frequencies.

17. The NMR RF coil of claim 15 including means allowing said RF coil to be energized so as to excite therein first and second orthogonal resonant modes, one of said modes being a desired mode, said pair of conductive loop elements each including an open circuit along the peripheries thereof where the desired mode has current minima so as to displace the frequency of the undesired mode relative to the frequency of the desired mode.

18. The NMR RF coil of claim 15 including means allowing said RF coil to be energized so as to excite therein first and second orthogonal resonant modes, one of said modes being a desired mode, said capacitive elements in segments carrying negligible current in the desired mode being replaced by short circuits so as to displace the frequency of the undesired mode relative to the frequency of the desired mode.

19. The NMR RF coil of claim 15 including means allowing said RF coil to be energized so as to excite therein first and second orthogonal resonant modes, one of said modes being a desired mode, said capacitive element in segments carrying negligible current in the desired mode being replaced by open circuits so as to displace the frequency of the undesired mode relative to the frequency of the desired mode.

20. The NMR RF coil of claim 19 wherein said coil comprises a head coil and wherein said conductive loop and segments are mounted on a substantially cylindrical coil form, which form is provided with a window in the region where said segments have been replaced by open circuits.

21. The NMR RF coil of claim 15 wherein said means comprises first and second means disposed on first and second segments, respectively, separated by an angle $\theta = 90°$.

22. The NMR RF coil of claim 26 wherein said first and second means each comprise a plurality of series-connected capacitive elements, the common points between said series-connected capacitive elements being selectable to adjust the input impedance of said RF coil.

23. The NMR RF coil of claim 15 wherein said means comprises a plurality of series-connected capacitive elements, the common points between said series-connected capacitive elements being selectable to adjust the input impedance of said RF coil.

24. The NMR RF coil of claim 13 wherein each of said segments comprises first and second sections, said sections being connected at one end to a respective one of said loop elements, the other end of said first sections having formed therein a recess for slidably receiving the other end of a corresponding one of said second sections, said other ends of said first and second sections being separated by a dielectric material, said segments being moveable relative to one another thereby to form a variable capacitive element.

25. The NMR RF coil of claim 13 comprising a first and second hollow cylindrical form of dielectric material, said forms being sized for telescoping movement relative to one another, said segments being composed of first and second sections supported by a major surface of said first and second forms, respectively, said first and second conductor sections being connected at one of the ends thereof to a respective one of said loop elements, the other ends of matching ones of first and second sections being positioned to overlap one another so as to form a capacitive element, the degree of overlap therebetween being adjustable by relative movement of said forms.

26. The NMR RF coil of claim 13 comprising:
a hollow cylindrical form of dielectric material, said segments being supported by a major surface thereof parallel to said longitudinal axis; and
said pair of conductive elements being disposed on a surface opposite to the surface of said form supporting said segments to form a capacitive element in the region of overlap between said loops and said segments, at least one of said loop elements being slidably disposed on said form so as to vary the region of overlap thereby to vary the capacitance of said capacitive element.

27. The NMR RF coil of claim 13 wherein at least one of said conductive loop elements includes a plurality of spaced apertures formed around the periphery thereof of slidably receiving corresponding ones of sail segments, said apertures being lined with a dielectric material toelectrically insulate said segment from said loop element so as to form fixed-value capacitive elements, the indoctance of the coil being adjustable by relative motion of said loop element having apertures formed therein along said segments to vary the length thereof.

28. The NMR RF coil of claim 13 wherein at least one of said segments includes at least one variable capacitive element.

29. An NMR radio-frequency (RF) coil comprising:
a pair of conductive loop elements disposed in a spaced-apart relation along a common longitudinal axis; and
a plurality of conductive segments each having at least one reactive element associated therewith, said segments electrically interconnecting said loop elements at points spaced along the periphery of each of said loop elements, said RF coil having means for being energized to achieve in operation, an approximately sinusoidal current distribution in said segments, said distribution being dependent on the angular position $\theta$ of each of said segments along the loop peripheries.

30. The NMR RF coil of claim 29 wherein said conductive segments are spaced at equal intervals along the periphery of each of said loops.

31. The NMR RF coil of claim 29 wherein said coil comprises an NMR RF head coil and wherein one of said conductive loop elements has a geometry fitable about the shoulders of a subject allowing the head to be more fully positioned within the coil.

32. The NMR RF coil of claim 29 wherin said reactive element comprises at least one capacitive element.

33. The NMR RF coil of claim 32 wherein said means includes first and second means allowing said RF coil to be energized so as to excite therein first and second orthogonal resonant modes having segment current distributions proportional to $\sin \theta$ and $\cos \theta$, respectively, said capacitive elements in segments where $\sin \theta$ is large having high capacitive values, while said capacitive elements in segments where $\cos \theta$ is large having lower capacitive values relative to said high values such that said first and second modes occur at different frequencies.

34. The NMR RF coil of claim 32 including means allowing said RF coil to be energized so as to excite therein first and second orthogonal resonant modes, one of said modes being a desired mode, said pair of conductive loop elements each including an open circuit along the peripheries thereof where the desired mode has current minima so as to displace the frequency of the undesired mode relative to the frequency of the desired mode.

35. The NMR RF coil of claim 32 including means allowing said RF coil to be energized so as to excite therein first and second orthogonal resonant modes, one of said modes being a desired mode, said capacitive elements in segments carrying negligible current in the desired mode being replaced by short circuits so as to displace the frequency of the undesired mode relative to the frequency of the desired mode.

36. The NMR RF coil of claim 32 including means allowing said RF coil to be energized so as to excite therein first and second orthogonal resonant modes, one of said modes being a desired mode, said capacitive elements in segments carrying negligible current in the desired mode being replaced by open circuits so as to displace the frequency of the undesired mode relative to the frequency of the desired mode.

37. The NMR RF coil of claim 36 wherein said coil comprises a head coil and wherein said conductive loop and segments are mounted on a substantially cylindrical coil form, which form is provided with a window in the region where said segments have been replaced by open circuits.

38. The NMR RF coil of claim 32 wherein said means comprises first and second means disposed on first and second segments, respectively, separated by an angle $\theta = 90°$.

39. The NMR RF coil of claim 38 wherein said first and second means each comprise a plurality of series-connected capacitive elements, the common points between said series-connected capacitive elements being selectable to adjust the input impedance of said RF coil.

40. The NMR RF coil of claim 32 wherein said means comprises a plurality of series-connected capacitive elements, the common points between said series-connected capacitive elements being selectable to adjust the input impedance of said RF coil.

41. An NMR RF coil comprising:
a first assembly having a pair of conductive loop elements disposed in a spaced apart relation along a common longitudinal axis and a plurality of conductive segments electrically connected at the ends thereof to said loop elements, each of said segments having at least one non-conductive gap formed therein; and
a second assembly, substantially identical to said first assembly, in which the gaps formed in the conductive segments are offset relative to the gaps in said first assembly;
said first and second assemblies being disposed coaxially relative to one another and being separated by a dielectric material, the loop elements of one assembly being electrically interconnected to a corresponding loop element of the other assembly, the gaps in each assembly being situated such that a gap in one assembly is bridged by a continuous portion of corresponding segment in the other assembly so as to form a capacitive element.

42. The NMR RF coil of claim 41 wherein the conductive segments in at least one of said first and second assemblies includes at least one electrically insulated conductive pad in the region of the nonconductive gap, said pad being electrically connectable to the remainder of the conductive segment to vary the area of overlap between corresponding segments of said first and second assemblies so as to adjust the capacitance of said capacitive element.

43. The NMR RF coil of claim 41 wherein said first and second assemblies comprise conductive patterns corresponding to said conductive loop and segment elements fabricated on opposite sides of a printed circuit board.

44. The NMR RF coil of claim 41 wherein said first and second assemblies comprise conductive patterns corresponding to said conductive loop and segment elements fabricated on opposite sides of a single printed circuit board.

45. The NMR RF coil of claim 44 wherein said first and second assemblies each comprise a plurality of subassemblies, each subassembly having fabricated thereon a fraction of the conductive pattern associated with one of said assemblies, which subassemblies are electrically interconnected at the conductive pattern portions thereof corresponding to said loop elements to form a complete assembly.

46. The NMR RF coil of claim 44 wherein each of said conductive loop elements includes a pair of open circuits formed therein so as to create two coil halves such that when, in operation, one of said halves is energized the other one is coupled thereto by mutual inductance.

47. The NMR RF coil of claim 41 including means allowing said coil to be energized across at least one of said capacitive elements in one of said conductive segments to achieve in operation a current in said segments approximating a sinusoidal distribution dependent on the segment angular position $\theta 0$ along the loop peripheries.

48. The NMR RF coil of claim 47 wherein said capacitive elements in segments positioned along the loop peripheries where said sinusoidal current distribution approximates a minimum magnitude comprise a short circuit.

49. The NMR RF coil of claim 47 wherein said capacitive elements in segments positioned along the loop peripheries where said sinusoidal current distribution approximates a minimum magnitude comprise an open circuit.

50. The NMR RF coil of claim 49 wherein said coil comprises a head coil and wherein said conductive loop and segments are mounted on a substantially cylindrical coil form, which form is provided with a window in the region where said segments have been replaced by open circuits.

51. The NMR RF coil of claim 47 wherein said means comprises first and second means disposed on first and second segments, respectively, separated by an angle $\theta = 90°$.

52. The NMR RF coil of claim 51 wherein said first and second means each comprise a plurality of series-connected capacitive elements, the common points between said series-connected capacitive elements being selectable to adjust the input impedance of said RF coil.

53. The NMR RF coil of claim 47 wherein said means comprises a plurality of series-connected capacitive elements, the common points between said series-connected capacitive elements being selectable to adjust the input impedance of said RF coil.

54. The NMR RF coil of claim 41 wherein said coil comprises an NMR RF head coil and wherein one of said conductive loop elements has a geometry fitable about the shoulders of a subject allowing the head to be more fully positioned within the coil.

55. The NMR RF coil of claim 41 wherein said conductive segments are spaced at equal intervals along the periphery of each of said loops.

56. The NMR RF coil of claim 55 wherein said segments are spaced along the periphery of each of said loops to form a configuration having four-fold symmetry.

57. The NMR RF coil of claim 55 wherein said segments are spaced along the periphery of each of said loops to form a configuration not having four-fold symmetry.

* * * * *

UNITED STATES PATENT AND TRADEMARK OFFICE
CERTIFICATE OF CORRECTION

PATENT NO. : 4,694,255

DATED : September 15, 1987

INVENTOR(S) : Cecil E. Hayes

It is certified that error appears in the above-identified patent and that said Letters Patent is hereby corrected as shown below:

Col. 4, line 19, delete "whole" and substitute therefor --solenoid--.

Col. 4, line 19, delete "ILLIGIBLE" and substitute therefor --to be examined. The other--.

Col. 4, line 54, delete "ILLIGIBLE p6" and substitute therefor --strip 6--.

Col. 4, line 68, delete "timing" and substitute therefor --tuning--.

Col. 7, line 3, delete "π" and substitute therefor --θ--.

Col. 7, line 18, second occurrence, delete "2N+10" and substitute therefor --2N+1--.

Col. 16, line 67, change "26" to --21--.

Col. 17, line 47, first occurrence, change "of" to --for--.

Col. 20, line 8, after "θ" delete "0".

Signed and Sealed this

First Day of November, 1988

Attest:

DONALD J. QUIGG

Attesting Officer

Commissioner of Patents and Trademarks